(12) United States Patent
Hayashi

(10) Patent No.: US 11,791,250 B2
(45) Date of Patent: Oct. 17, 2023

(54) LEAD FRAME, SEMICONDUCTOR DEVICE, AND LEAD FRAME MANUFACTURING METHOD

(71) Applicant: SHINKO ELECTRIC INDUSTRIES CO., LTD., Nagano (JP)

(72) Inventor: Shintaro Hayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 109 days.

(21) Appl. No.: 16/668,078

(22) Filed: Oct. 30, 2019

(65) Prior Publication Data
US 2020/0144166 A1 May 7, 2020

(30) Foreign Application Priority Data

Nov. 7, 2018 (JP) .................................. 2018-209997

(51) Int. Cl.
*H01L 23/495* (2006.01)
*H01L 21/48* (2006.01)
*H01L 23/31* (2006.01)

(52) U.S. Cl.
CPC .... *H01L 23/49582* (2013.01); *H01L 21/4821* (2013.01); *H01L 23/3107* (2013.01); *H01L 23/49541* (2013.01)

(58) Field of Classification Search
CPC ......... H01L 23/49558; H01L 23/49541; H01L 23/49548; H01L 23/49551; H01L 23/49582; H01L 23/49586
See application file for complete search history.

(56) References Cited

U.S. PATENT DOCUMENTS

| | | | | |
|---|---|---|---|---|
| 6,166,430 A * | 12/2000 | Yamaguchi | ......... | H01L 23/3121 257/E23.125 |
| 6,528,879 B2 * | 3/2003 | Sakamoto | ......... | H01L 23/49575 257/729 |
| 6,909,168 B2 * | 6/2005 | Minamio | .......... | H01L 23/49548 257/730 |
| 7,301,226 B2 * | 11/2007 | Seki | ........................ | H01L 24/48 257/676 |

(Continued)

FOREIGN PATENT DOCUMENTS

JP      10-041325 A      2/1998
JP      2004-349497      9/2004

(Continued)

OTHER PUBLICATIONS

Japanese Office Action dated Aug. 2, 2022 issued in corresponding Japanese application No. 2018-209997; English machine translation included (6 pages).

(Continued)

*Primary Examiner* — Dale E Page
*Assistant Examiner* — Abbigale A Boyle
(74) *Attorney, Agent, or Firm* — Rankin, Hill & Clark LLP

(57) ABSTRACT

A lead frame includes: a lead portion; a plating layer that is provided on a connected area of the lead portion, the connected area being an area connected with a semiconductor element; a recessed portion that is provided around the plating layer on the lead portion; and an oxidized layer that is provided on a surface including the recessed portion of the lead portion.

15 Claims, 12 Drawing Sheets

(56) References Cited

U.S. PATENT DOCUMENTS

| | | | | |
|---|---|---|---|---|
| 7,407,834 | B2* | 8/2008 | Shimanuki | H01L 23/3107 438/111 |
| 8,043,898 | B2* | 10/2011 | Lee | H01L 21/4832 438/121 |
| 8,106,492 | B2* | 1/2012 | Chang Chien | H01L 21/4832 257/676 |
| 8,178,955 | B2* | 5/2012 | Itou | H01L 21/561 257/667 |
| 8,236,612 | B2* | 8/2012 | San Antonio | H01L 24/16 438/113 |
| 8,633,063 | B2* | 1/2014 | Do | H01L 23/49582 438/123 |
| 8,866,296 | B2* | 10/2014 | Yamaji | H01L 24/83 257/E23.047 |
| 9,018,745 | B2* | 4/2015 | Shimizu | H01L 23/49568 257/676 |
| 9,824,960 | B2* | 11/2017 | Ishibashi | H01L 23/49582 |
| 2006/0071307 | A1* | 4/2006 | Shirasaka | H01L 23/3107 257/E23.042 |
| 2015/0380342 | A1* | 12/2015 | Kashiwazaki | H01L 24/32 438/123 |
| 2018/0040543 | A1 | 2/2018 | Ishibashi et al. | |

FOREIGN PATENT DOCUMENTS

| | | |
|---|---|---|
| JP | 2004-332105 | 11/2004 |
| JP | 2015-153987 A | 8/2015 |
| JP | 2017-28152 A | 2/2017 |
| JP | 2018-056386 A | 4/2018 |

OTHER PUBLICATIONS

Japanese Office Action dated Jan. 17, 2023 issued in corresponding Japanese application No. 2018-209997; English machine translation included (7 pages).

* cited by examiner

FIG.8I
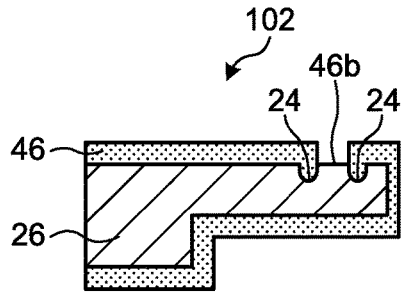 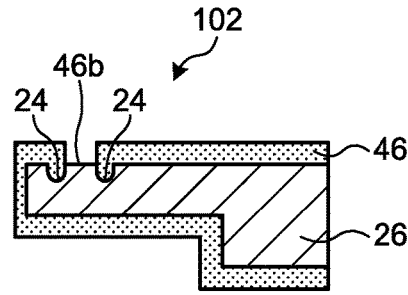
FIG.8J
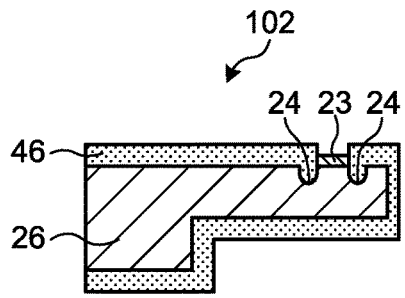 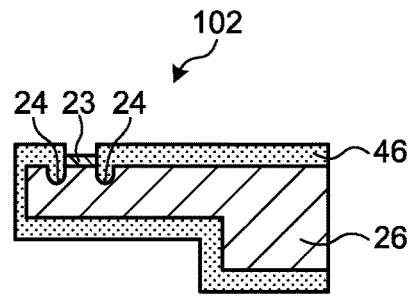
FIG.8K
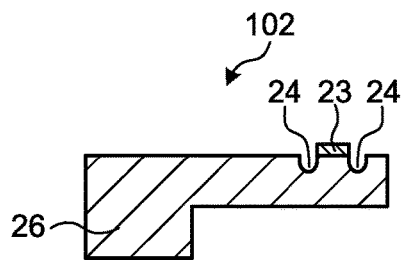 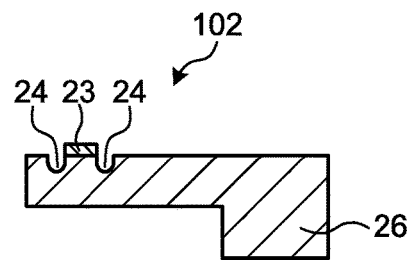
FIG.8L
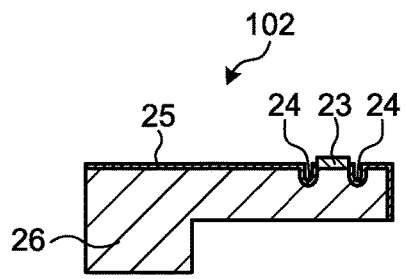 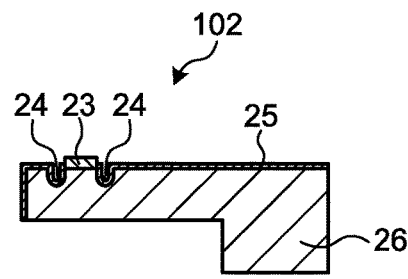

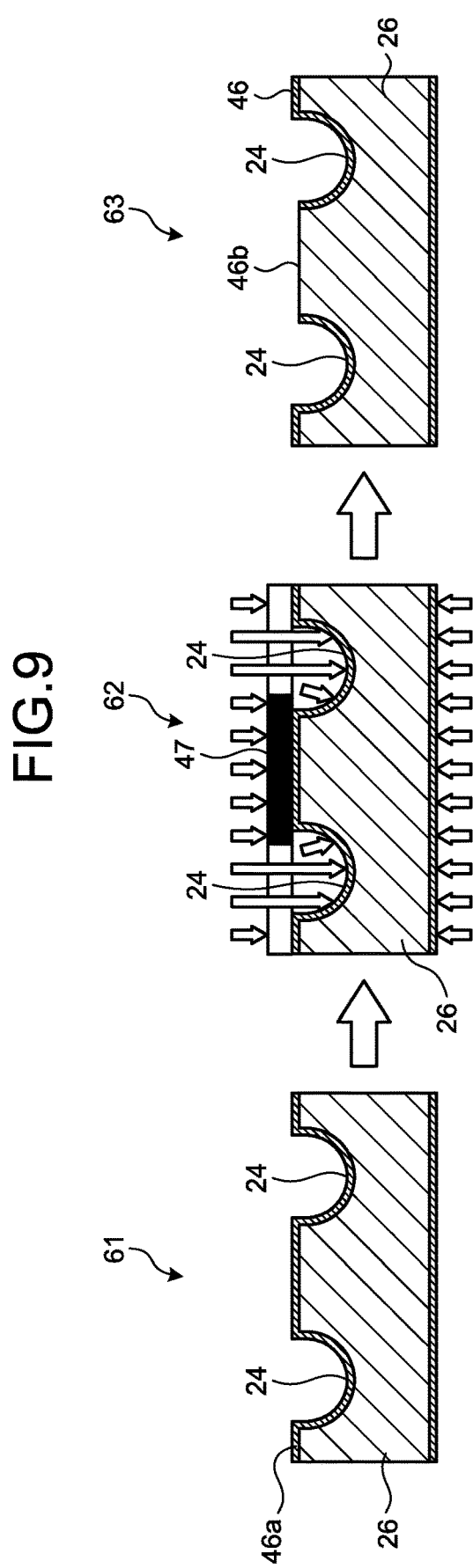

LEAD FRAME, SEMICONDUCTOR DEVICE, AND LEAD FRAME MANUFACTURING METHOD

CROSS-REFERENCE TO RELATED APPLICATION

This application is based upon and claims the benefit of priority of the prior Japanese Patent Application No. 2018-209997, filed on Nov. 7, 2018, the entire contents of which are incorporated herein by reference.

FIELD

The embodiment discussed herein is related to a lead frame, a semiconductor device, and a lead frame manufacturing method.

BACKGROUND

As a thin profile semiconductor device, a flip chip (FC)-quad flat non-leaded package (QFN)-type semiconductor device has been known. Such an FC-QFN semiconductor device includes a semiconductor element that is placed on a stage of the lead frame and is encapsulated with a mold resin, and lead portions that are partly exposed from the rear surface of the mold resin covering the opposite side of the stage.

In the fabrication process of such an FC-QFN semiconductor device, to begin with, a metal substrate is etched to achieve a lead frame that has a matrix-like arrangement of areas corresponding to semiconductor elements. In the lead frame, the areas corresponding to the semiconductor elements are partitioned by connecting bars. The connecting bars are also referred to as sawing bars. A plurality of lead portions provided in a manner surrounding each of the semiconductor elements are connected to the connecting bars.

In the FC-QFN semiconductor device fabrication process, Cu pillars are then placed on a semiconductor element, and solder is applied to the tips of the Cu pillars. The semiconductor element with the Cu pillars having solder applied to their tips is then reversed and placed on the lead frame, and the semiconductor element is bonded to the lead frame by melting the solder. Molding for encapsulating the semiconductor element with a mold resin is then carried out. Sawing for separating the semiconductor elements by cutting the mold resin and the connecting bars with a sawing blade is then performed.

In the FC-QFN semiconductor device fabrication process, after the semiconductor element is reversed and placed on the lead frame, reflow is carried out to bond the semiconductor element to the lead frame. If the lead frame surface is made of Cu, it is quite possible that the solder does not wet-spread across the lead frame, so that the semiconductor element is caused to move, and the position thereof does not stabilize. To address this issue, having been available to improve the bondability and to prevent the misalignment of the chip is a technology for providing Ag plating with which solder exhibits high wettability to the bonding surface, and treating the area surrounding Ag-plated area with copper oxide that is not wettable with the solder. Related Art examples are disclosed in Japanese Laid-open Patent Publication No. 2004-349497 and Japanese Laid-open Patent Publication No. 2004-332105.

However, because the process for forming the plating layer on a part of the bonding surface is carried out after the shape of the lead frame is formed by etching, for example, the positions of the area of the plating layer and the terminals may become misaligned with respect to each other. Furthermore, when the plating layer is positioned near an end surface of the lead frame, the plating may be chipped due to such a misalignment.

SUMMARY

According to an aspect of an embodiment, a lead frame includes: a lead portion; a plating layer that is provided on a connected area of the lead portion, the connected area being an area connected with a semiconductor element; a recessed portion that is provided around the plating layer on the lead portion; and an oxidized layer that is provided on a surface including the recessed portion of the lead portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8I is a sectional view illustrating the lead frame manufacturing method according to the embodiment;
FIG. 8J is a sectional view illustrating the lead frame manufacturing method according to the embodiment;
FIG. 8K is a sectional view illustrating the lead frame manufacturing method according to the embodiment;
FIG. 8L is a sectional view illustrating the lead frame manufacturing method according to the embodiment;
FIG. 9 is a schematic for explaining removal of plating resist;

DESCRIPTION OF EMBODIMENT

An embodiment of a lead frame, a semiconductor device, and a lead frame manufacturing method disclosed herein will now be explained in detail with reference to some drawings. The embodiment described below is not intended to limit the scope of the lead frame, the semiconductor device, and the lead frame manufacturing method disclosed herein in any way.

Configuration of Lead Frame

Figure 1:
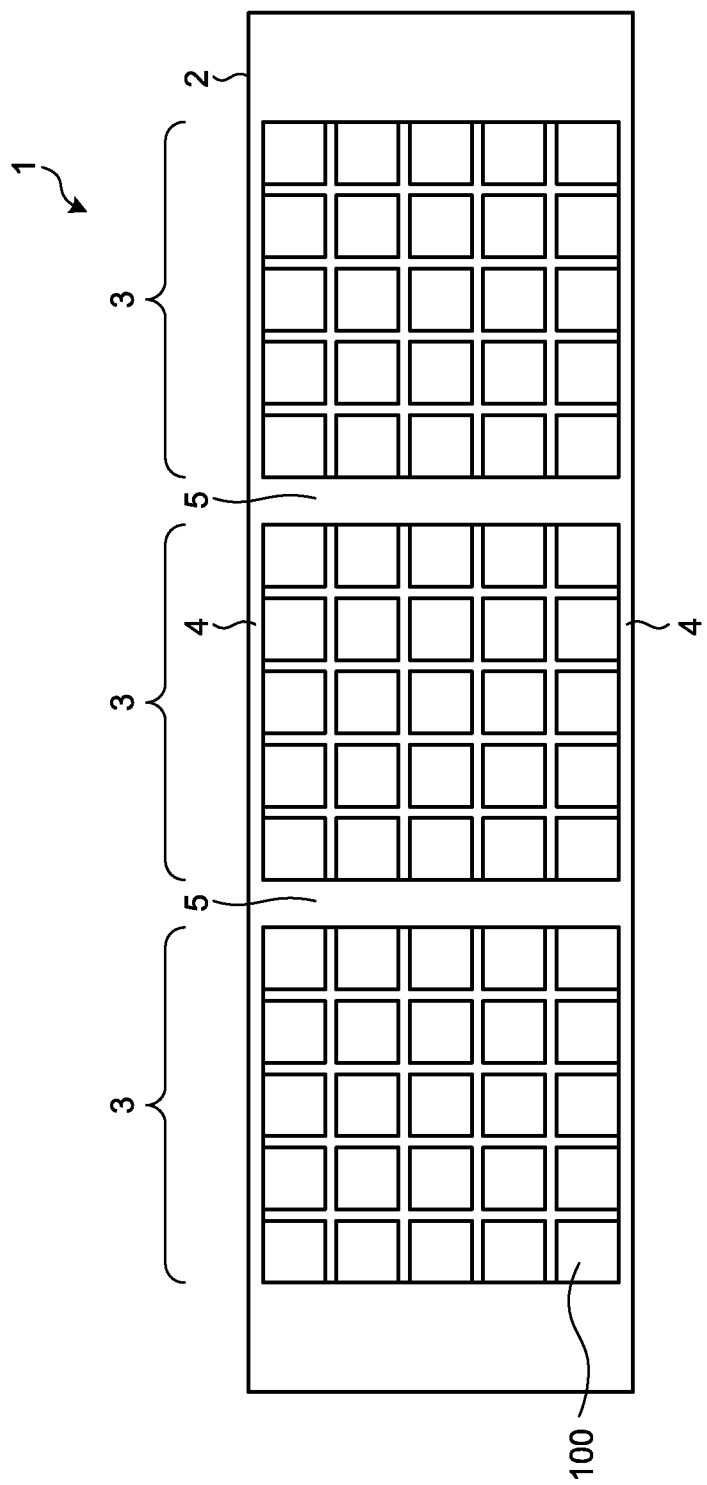
FIG. 1 is a schematic plan view of a lead frame.

FIG. 1 is a schematic plan view of a lead frame. As illustrated in FIG. 1, this lead frame 1 includes a substrate frame 2 having a substantially rectangular shape in a plan view. As a material for the substrate frame 2, Copper (Cu), a Cu-based alloy, iron-nickel (Fe—Ni), or an Fe—Ni-based alloy, for example, may be used. The thickness of the substrate frame 2 may be set to 0.05 millimeter to 0.25 millimeter or so, for example.

In the substrate frame 2, a plurality of resin-molded areas 3 are defined in a manner separated from one another. In this embodiment, the substrate frame 2 has three resin-molded areas 3. In each of the resin-molded areas 3, a plurality of unit lead frames 100 are formed in a connected fashion, in a matrix-like shape. In this embodiment, each of the resin-molded areas 3 includes an arrangement of five-by-five unit lead frames 100. On each of these unit lead frames 100, a semiconductor element is placed, and each of the unit lead frames 100 is eventually cut out as an independent semiconductor device (package). Around the perimeter of each of the resin-molded areas 3, a rail portion 4 extending in a longitudinal direction (the left-and-right direction in FIG. 1), and a rail portion 5 extending in a width direction (the up-and-down direction in FIG. 1) are provided. In the process of semiconductor device assembly, a semiconductor element is placed on each of the unit lead frames 100, and the semiconductor elements are molded at once, in units of one resin-molded area 3.

Figure 2:
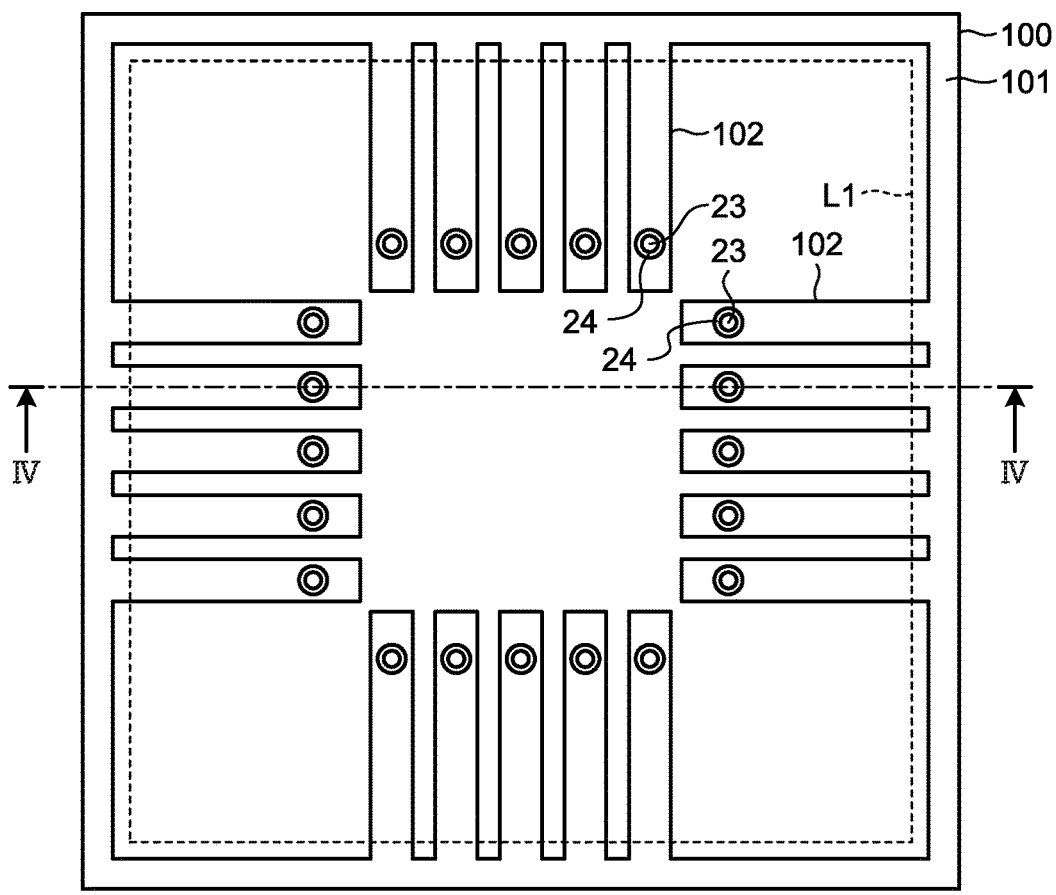
FIG. 2 is a plan view of a unit lead frame.

FIG. 2 is a plan view of a unit lead frame 100. In the explanation hereunder, the unit lead frame 100 will be simply referred to as a lead frame 100. In the explanation hereunder, a "front surface" refers to a surface facing the stage on which a semiconductor element 21, which will be described later, is to be placed, and a "rear surface" refers to the surface facing the opposite side of the stage on which the semiconductor element 21 is to be placed.

The lead frame 100 includes a frame portion 101 and a plurality of leads 102 supported by the frame portion 101. The frame portion 101 has a rectangular frame-like shape. The leads 102 are provided in a manner perpendicularly intersecting with the frame portion 101, and extending inwards from the frame portion 101. The leads 102 are cut off across the cutting line L1, and come to serve as members of the semiconductor device.

Figure 3:
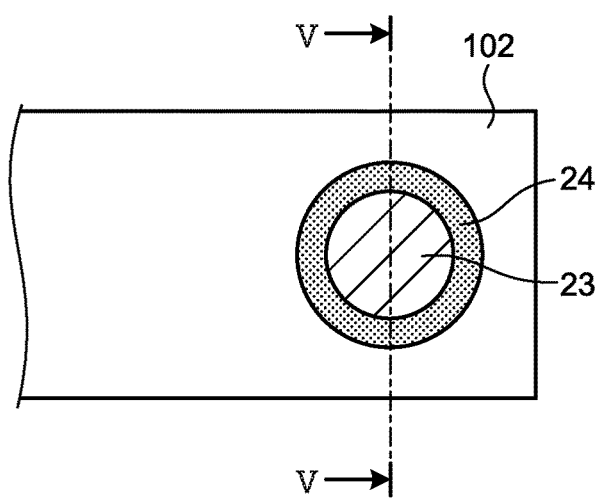
FIG. 3 is a schematic giving an enlarged view of an inner end of the lead.

On an inner end of the lead 102, a plating layer 23 is provided. FIG. 3 is a schematic giving an enlarged view of the inner end of the lead. The plating layer 23 is provided to facilitate implementation of a semiconductor element 21 on the lead 102. For the plating layer 23, silver (Ag) plating may be used, for example. For the plating layer 23, a nickel (Ni) plating, palladium (Pd) plating, gold (Au) plating, or the like may also be used. Furthermore, the plating layer 23 may consist of a plurality of plating layers, e.g., a Ni plating layer and an Ag plating layer formed on top of each other. The Ni plating layer and the Au plating layer may be placed on top of each other, for example, in the order listed herein, from the side of the lead 102, as the plating layer 23. It is also possible to place a Ni plating layer, a Pd plating layer, and an Au plating layer on top of one another, in the order listed herein, from the side of the lead 102, as the plating layer 23. A recessed portion 24 is then formed in a manner surrounding the plating layer 23.

Figure 4:
FIG. 4 is a sectional view of the lead frame across the line IV-IV in FIG. 2.

FIG. 4 is a sectional view of the lead frame across the line IV-IV in FIG. 2. As illustrated in FIG. 4, the lead 102 has a base plate 26 that is a metal plate. The base plate 26 is conductive. As the material for the base plate 26, a metal such as copper (Cu), a Cu alloy, or a 42 alloy that is an alloy of iron and nickel may be used, for example.

The base plate 26 has a smaller thickness near the center in a longitudinal direction extending from the frame portion 101 toward the center, as illustrated in FIG. 2, the thickness being smaller by being recessed from the side of the rear surface. In this embodiment, a part of the rear surface of the base plate 26 is recessed, but without limitation thereto, and it is also possible not to remove any of the rear surface of the base plate 26, or to remove the thickness from the entire rear surface, for example.

The lead 102 has the plating layer 23 that is provided to an area near the tip of the base plate 26 in a direction travelling toward the center of the lead frame 100 illustrated in FIG. 2. The lead 102 also has the recessed portion 24 that is recessed from the front surface of the base plate 26, in a manner surrounding the plating layer 23. The lead 102 also has an oxidized layer 25 in the area other than the area of the plating layer 23 in the front surface. The oxidized layer 25 is also provided to the area corresponding to the recessed portion 24. The oxidized layer 25 is a film of oxidized copper, for example.

Figure 5:
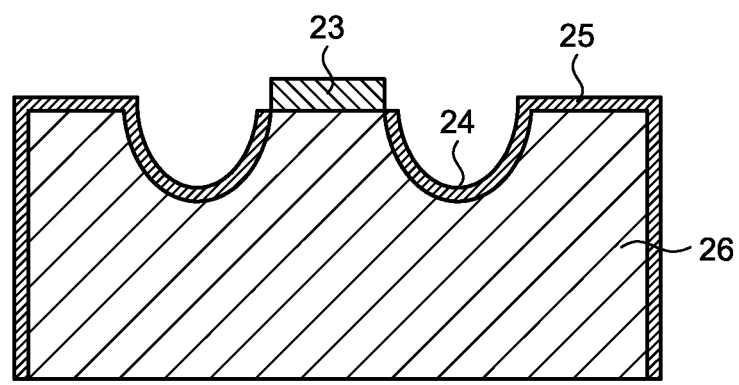
FIG. 5 is a sectional view of the lead frame across the line V-V in FIG. 3.

FIG. 5 is a sectional view of the lead frame across the line V-V in FIG. 3. In this embodiment, the area of the plating layer 23 is circular, and the recessed portion 24 has an annular shape surrounding the plating layer 23. Therefore, the cross section illustrated in FIG. 5 across the line V-V is the same as an enlargement of FIG. 4 near the plating layer 23. As illustrated in FIG. 5, the cross section of the recessed portion 24 delineates a semi-circular curve. The oxidized layer 25 is then provided to the area including the entire area of the recessed portion 24 provided in a manner surrounding the plating layer 23.

Structure of Semiconductor Device

Figure 6:
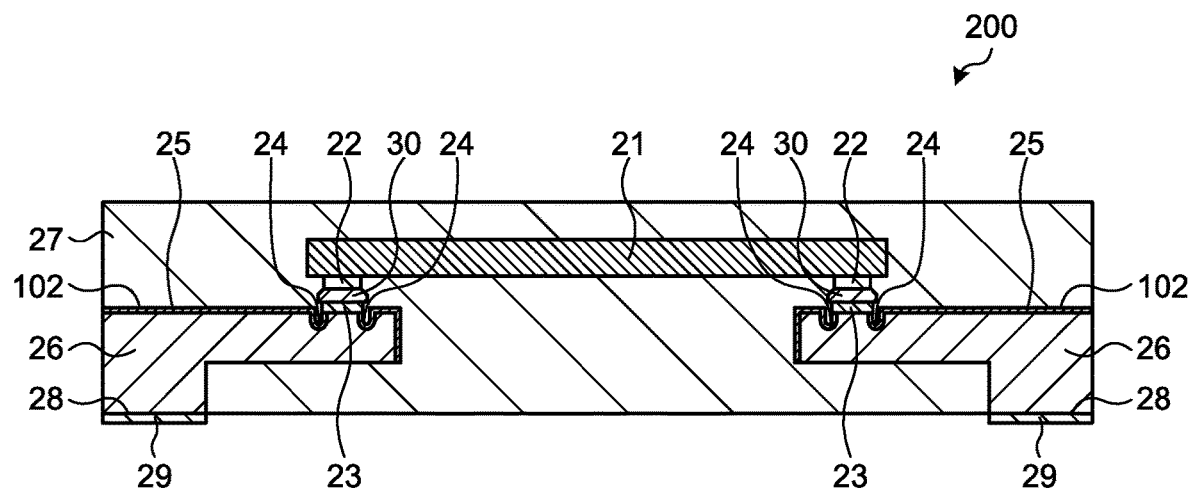
FIG. 6 is a sectional view of a semiconductor device fabricated using the lead frame according to the embodiment.

A semiconductor device 200 fabricated using the lead frame 100 according to the embodiment will now be explained with reference to FIG. 6. FIG. 6 is a sectional view of the semiconductor device fabricated using the lead frame according to the embodiment. FIG. 6 illustrates a cross section of the semiconductor device 200 at the same position as the cross section across the line IV-IV in FIG. 2, but with a semiconductor element 21 mounted on the lead 102.

Examples of the semiconductor element 21 include an integrated circuit, a large-scale integrated circuit, a transistor, a thyristor, and a diode. The semiconductor element 21 has Cu pillars 22 serving as electrodes. The Cu pillars 22 have the same shape, in the plan view, as the plating layer 23, for example. The Cu pillar 22 is then connected to the plating layer 23 on the lead 102 via solder 30. As the solder 30, a solder ball may be used, for example.

Figure 7:
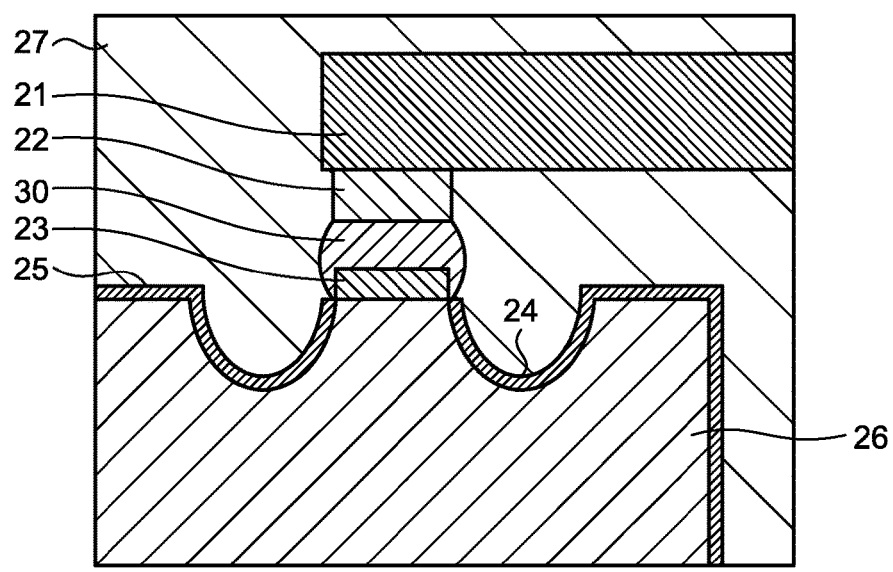
FIG. 7 is an enlarged view of the part where the semiconductor element in the semiconductor device is bonded to the lead.

As illustrated in FIG. 7, the oxidized layer 25 is formed in a manner surrounding the plating layer 23. FIG. 7 is an enlarged view of the part where the semiconductor element in the semiconductor device is bonded to the lead. The wettability of the solder 30 with the oxidized layer 25 is not high. Therefore, by covering the area around the plating layer 23 with the oxidized layer 25, the solder 30 is suppressed from spreading to an extent larger than necessary (bleeding out), on the lead 102.

Referring back to FIG. 6, the explanation is continued. The semiconductor elements 21 and the leads 102 are covered by mold resin 27. As the mold resin 27, an epoxy resin or a silicone resin may be used, for example. In each of the leads 102, an outer terminal 28 is exposed from the mold resin 27, on the rear surface of the semiconductor device 200. In each of the leads 102, the outer terminal 28 is covered by a plating layer 29.

Lead Frame Manufacturing Method

A method for manufacturing the lead frame 100 illustrated in FIG. 2 will now be explained with reference to FIGS. 8A to 8L. FIGS. 8A to 8L are sectional views illustrating the lead frame manufacturing method according to the embodiment.

Figure 8A:
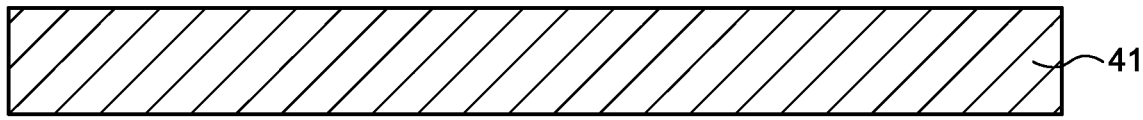
FIG. 8A is a sectional view illustrating a lead frame manufacturing method according to the embodiment.

To begin with, as illustrated in FIG. 8A, a flat plate-like metal substrate 41 is prepared. A metal such as copper, a copper alloy, or a Fe—Ni alloy may be used, as the material for the metal substrate 41.

Figure 8B:
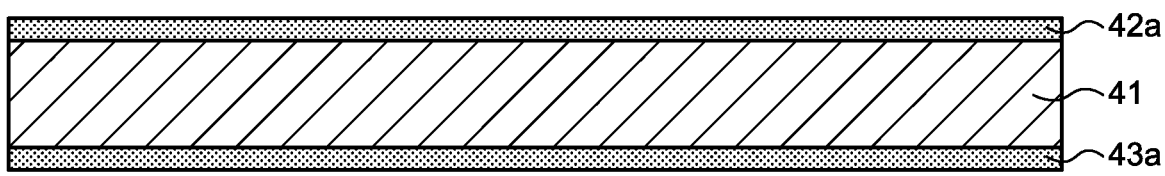
FIG. 8B is a sectional view illustrating the lead frame manufacturing method according to the embodiment.

At the next step, as illustrated in FIG. 8B, a photoresist 42a and a photoresist 43a are provided across the entire front and rear surfaces of the metal substrate 41, respectively. For example, the photoresists 42a and 43a are achieved by pasting a film-like resist, which is called a dry film resist, on the metal substrate 41. Alternatively, it is also possible to form the photoresists 42a and 43a by applying liquid resist solution and finishing the solution, instead of using the dry film resist.

Figure 8C:
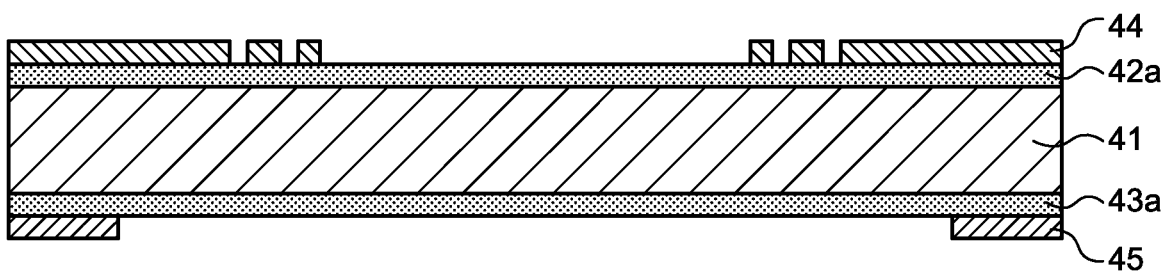
FIG. 8C is a sectional view illustrating the lead frame manufacturing method according to the embodiment.

At the next step, as illustrated in FIG. 8C, the photoresists 42a, 43a are exposed using photomasks 44 and 45 having a predetermined pattern.

Figure 8D:
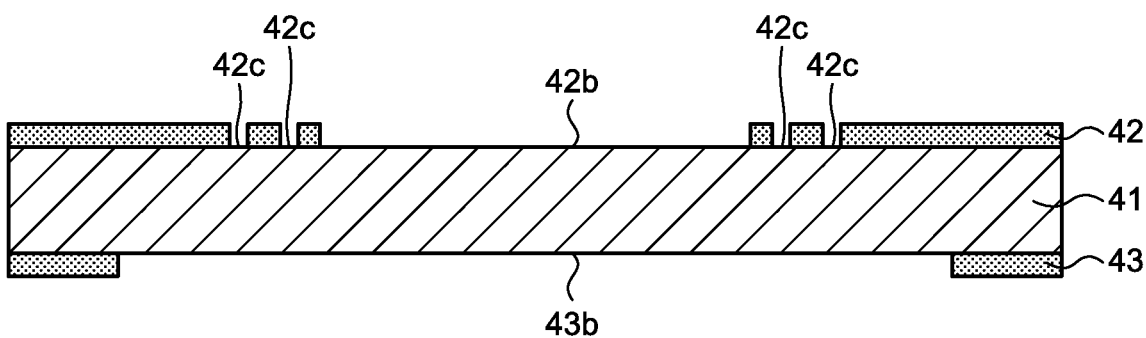
FIG. 8D is a sectional view illustrating the lead frame manufacturing method according to the embodiment.

At the next step, as illustrated in FIG. 8D, the exposed photoresists 42a and 43a are developed into resist layers 42 and 43 having predetermined openings.

Specifically, an opening 42b is formed in the area that is to be through-etched, on the front surface of the metal substrate 41. Furthermore, an opening 42c is formed in the area that is to be half-etched, and that is the area where the recessed portion 24 is to be formed, on the front surface of the metal substrate 41. On the rear surface of the metal substrate 41, an opening 43b is formed across the area to be through-etched and the area to be half-etched.

Figure 8E:
FIG. 8E is a sectional view illustrating the lead frame manufacturing method according to the embodiment.

At the next step, as illustrated in FIG. 8E, the base plate 26 is created by etching the metal substrate 41 with an etching solution, using the resist layers 42 and 43 as a mask (anti-corrosion mask). The etching solution can be chosen as appropriate, depending on the material used for the metal substrate 41. For example, when copper is used as the metal substrate 41, ferric chloride solution or cupric chloride solution is used, for example. The metal substrate 41 is etched by spraying the etching solution onto the front surface and the rear surface of the metal substrate 41, using a spray, for example. As a result, the base plate 26 having a plurality of leads 102 is formed. As the leads 102 are formed, the recessed portions 24 recessed from the front surface of the base plate 26 are also formed. At this time, because the size of the opening 42c is small, a smaller amount of etching solution is supplied to the opening 42c, compared to that supplied to the opening 42b. Therefore, the recessed portion 24 is formed by half-etching to such a degree that the recessed portion 24 does not penetrate through to the rear surface of the base plate 26. These recessed portions 24 are formed at the same time as the leads 102 are formed, therefore, do not become misaligned with respect to the leads 102, and can be formed at desired positions.

Figure 8F:
FIG. 8F is a sectional view illustrating the lead frame manufacturing method according to the embodiment.

At the next step, as illustrated in FIG. 8F, the resist layers 42, 43 are peeled off and removed.

Figure 8G:
FIG. 8G is a sectional view illustrating the lead frame manufacturing method according to the embodiment.

At the next step, as illustrated in FIG. 8G, the lead frame 100 in the condition as illustrated in FIG. 8F is soaked into liquid resist, a plating resist 64a is applied to the area including the recessed portion 24, and the lead frame 100 is then dried. The plating resist 64a is a negative resist so that exposed parts remain.

Figure 8H:
FIG. 8H is a sectional view illustrating the lead frame manufacturing method according to the embodiment.

At the next step, as illustrated in FIG. 8H, the plating resist 46a is exposed, using a photomask 47 covering the area surrounded by the recessed portion 24.

At the next step, as illustrated in FIG. 8I, a plating resist layer 46 with an opening 46b via which the area surrounded by the recessed portion 24 is exposed is then formed by developing the exposed plating resist 46a.

At the next step, as illustrated in FIG. 8J, the plating layer 23 is formed on the exposed part of the front surface of the base plate 26, being exposed via the opening 46b. The plating layer 23 is formed by electroplating, by receiving power supply via the base plate 26, for example. It is also possible to use electrodeless plating, instead of electroplating, to form the plating layer 23.

The plating resist layer 46 is then peeled off and removed, as illustrated in FIG. 8K.

At the next step, as illustrated in FIG. 8L, the oxidized layer 25 is then formed on the front surface of the base plate 26. The oxidized layer 25 can be achieved by oxidizing the front surface of the base plate 26. This oxidation is an oxidation not reacting with the plating layer 23. For example, as the oxidation, it is possible to use forced oxidation in which the lead frame 100 is immersed in a blackening solution and anodized. In such a case, it is possible to suppress the oxidation of the rear surface of the lead frame 100 while the front surface is oxidized, by setting the side of the front surface as an anode, and the side of the rear surface as a cathode. Furthermore, this oxidation may also be achieved by spraying a blackening solution onto the lead frame 100. Alternatively, it is also possible to use a method such as pasting a film onto the part that is not to be oxidized so that a predetermined area is oxidized, for example. In this oxidation, only the front surface of the base plate 26 may be oxidized, or the front and side surfaces of the base plate 26 may be oxidized. The oxidized layer 25 formed by the anodization contains copper I oxide ($Cu_2O$), copper II oxide (CuO) or copper hydroxide ($Cu(OH)_2$), for example.

The blackening solution is a mixture of a strong alkaline compound and an oxidant, for example. Sodium hydroxide or potassium hydroxide may be used as the strong alkaline compound, for example, and the compound may be solely used, or two or more of these compounds may be used as a mixture. As the oxidant, sodium chlorite may be used, for example. An additive may also be added thereto. As an example of the blackening solution, it is possible to use a solution containing 0 g/L to 100 g/L of sodium chlorite ($NaClO_2$), 5 g/L to 60 g/L of sodium hydroxide (NaOH), and 0 g/L to 200 g/L of trisodium phosphate ($Na_3PO_4$). The oxidation may be carried out under conditions including a solution temperature of 50 degrees to 80 degrees, oxidation time of approximately 1 second to 20 seconds, and a cathode current density of 0.2 $A/cm^2$ to 10 $A/cm^2$, for example.

In this manner, the lead frame 100 having the leads 102 is manufactured.

Removal of the plating resist from the area surrounded by the recessed portion 24 will now be explained in detail with reference to FIG. 9. FIG. 9 is a schematic for explaining removal of the plating resist.

A condition 61 represents a condition after the plating resist 46a has been formed on the front surface of the base plate 26. The condition 61 represents a condition illustrated in FIG. 8G. As illustrated as a condition 62, the photomask 47 made of a film or glass, and covering the area surrounded by the recessed portion 24 is then placed. This condition represents the condition illustrated in FIG. 8H.

The photomask 47 has a size smaller than the area inside of the outer circumference of the recessed portion 24, but larger than the area inside of the inner circumference of the recessed portion 24. Specifically, it is preferable for the photomask 47 to have a width allowance twice or more the misalignment capability of the device for placing the photomask 47, in any directions with respect to the area on which the plating layer 23 is intended to be formed. For example, assuming that the device for placing the photomask 47 produces a misalignment of 50 micrometers at the maximum, it is preferable, in this embodiment, for the photomask 47 to have a diameter larger than the diameter of the circular area inside of the inner circumference of the recessed portion 24, by a distance of 100 micrometers. In other words, when the centers of the photomask 47 and of the circular area surrounded by the inner circumference of the recessed portion 24 match, the photomask 47 sticks out from the inner circumference of the recessed portion 24 by 50 micrometers.

Furthermore, it is also preferable, in relation to the size of the recessed portion 24, for the distance from the inner circumference to the outer circumference thereof to be twice or more the misalignment capability of the device for placing the photomask 47. In other words, the photomask 47 may occupy an area up to a half the distance between the outer circumference and the inner circumference of the recessed portion 24. Furthermore, it is more preferable if the recessed portion 24 is deeper, provided that the depth of the recessed portion 24 is determined by the plate thickness of the base plate 26, and takes up 50% or so of the plate thickness.

A condition 62 is the condition after being exposed, by being irradiated with light, with the photomask 47 covering the area inside of the inner circumference of the recessed portion 24. In FIG. 9, the irradiating light that leads to the condition 62 is indicated by arrows. At this time, the light having entered between the photomask 47 and the outer circumference of the recessed portion 24 is diffracted, refracted, and is reflected on the surface of the recessed portion 24. As a result, the area not directly irradiated with the light, between the photomask 47 and the inner circumference of the recessed portion 24, is also exposed. As a result, as indicated as a condition 63, it is possible to expose almost the entire area other than the area surrounded by the inner circumference of the recessed portion 24 and with which the photomask 47 has been in contact, so that the plating resist 46a can be mainly removed from the area surrounded by the inner circumference of the recessed portion 24 and with which the photomask 47 has been in contact. In this manner, the plating resist layer 46 having the opening 46b, through which the area surrounded by the inner circumference of the recessed portion 24 is exposed, is formed, as indicated as the condition 63. This condition represents the condition illustrated in FIG. 8I.

Figure 10:
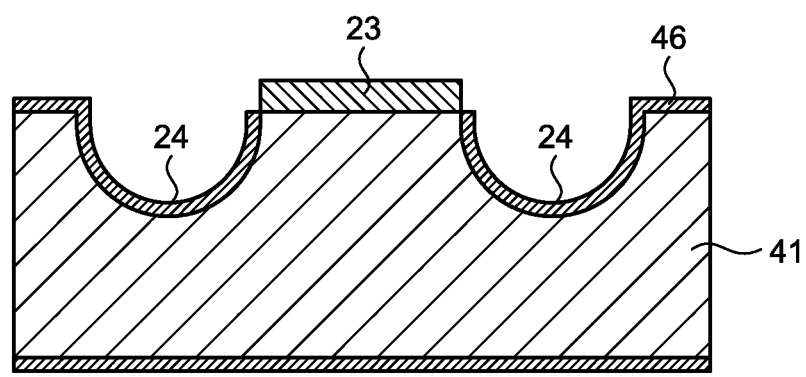
FIG. 10 is an enlarged sectional view of a part around a plating layer on the lead on which a plating resist layer is formed.

Then, by forming the plating layer 23 on the lead 102 in the condition 63, the plating layer 23 can be formed at the position of the opening 46b of the plating resist layer 46, as illustrated in FIG. 10. In this manner, the plating layer 23 can be formed at the desired position of the lead 102. FIG. 10 is an enlarged sectional view of a part around the plating layer 23 on the lead frame on which the plating resist layer 46 is formed. This condition represents the condition illustrated in FIG. 8J.

Figure 11:
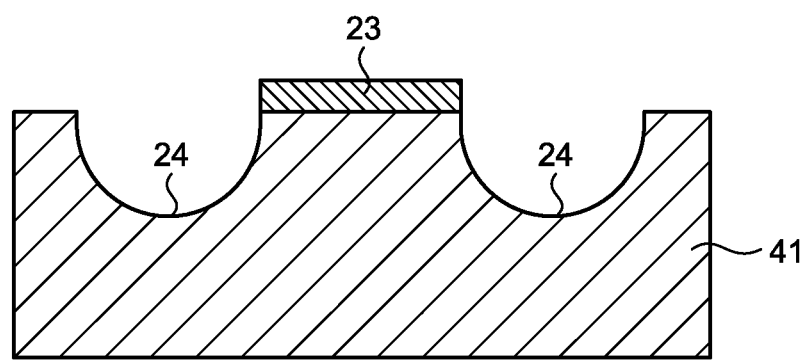
FIG. 11 is an enlarged sectional view of the part around the plating layer on the lead frame after the plating resist is removed.

Then, by removing the plating resist layer 46 from the lead 102 in the condition illustrated in FIG. 10, it is possible to obtain the lead 102 with the plating layer 23 formed at a desired position of the lead 102, as illustrated in FIG. 11. FIG. 11 is an enlarged sectional view of the part around the plating layer 23 on the lead frame after the plating resist layer 46 is removed. This condition represents the condition illustrated in FIG. 8K.

Method for Fabricating Semiconductor Device

Figure 12A:
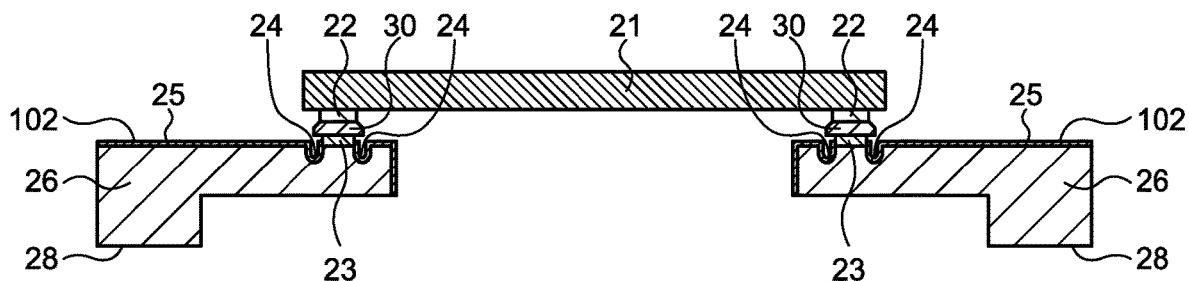
FIG. 12A is a sectional view illustrating a method for fabricating the semiconductor device according to the embodiment.
Figure 12B:
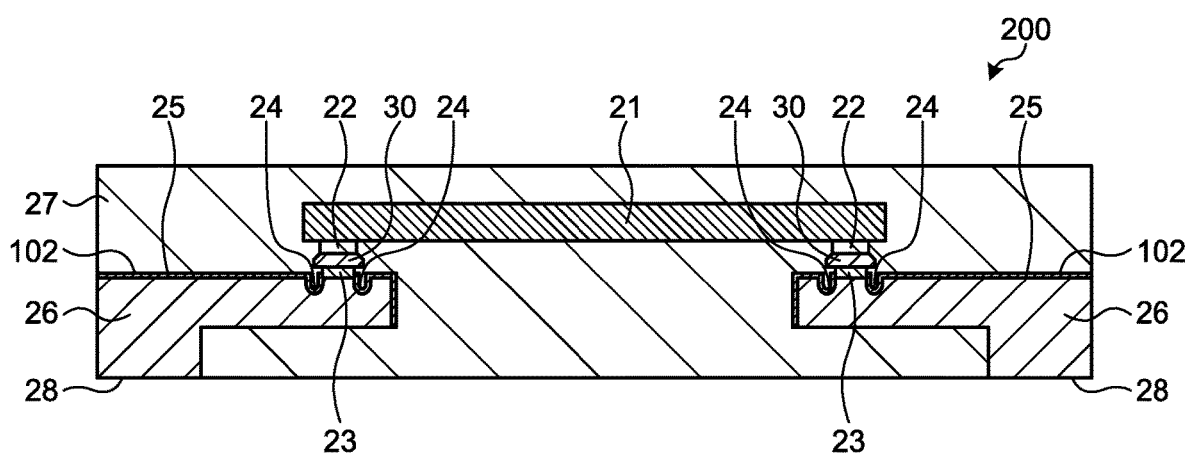
FIG. 12B is a sectional view illustrating the method for fabricating the semiconductor device according to the embodiment.
Figure 12C:
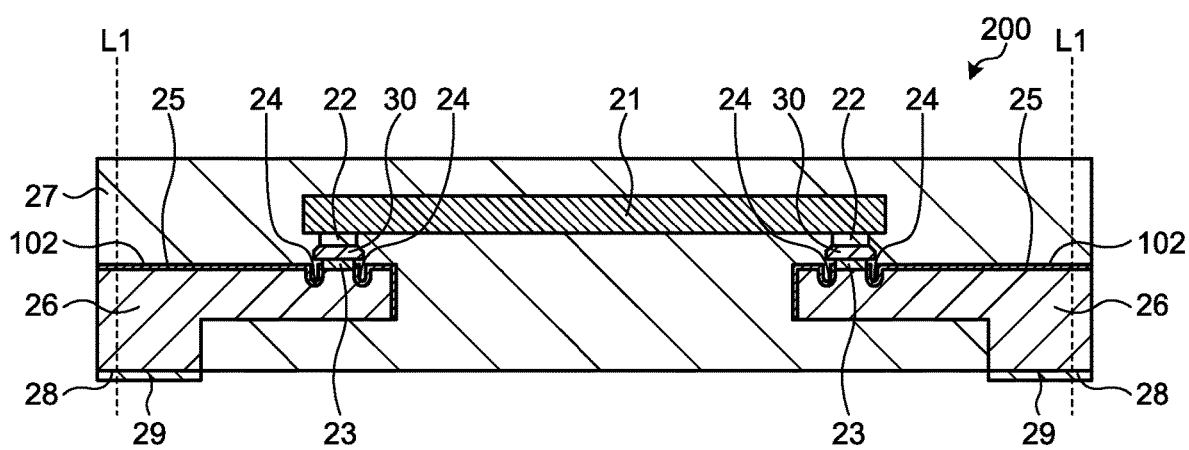
FIG. 12C is a sectional view illustrating the method for fabricating the semiconductor device according to the embodiment.

A method for fabricating the semiconductor device 200 illustrated in FIG. 6 will now be explained with reference to FIGS. 12A to 12C. FIGS. 12A to 12C are sectional views illustrating a method for fabricating the semiconductor device according to the embodiment.

At the step illustrated in FIG. 12A, the semiconductor element 21 is implemented on the lead 102. The solder 30 is attached to at least one of the plating layers 23 on the lead frame 100 and the Cu pillars 22 that are the electrodes of the semiconductor element 21. The solder 30 may be attached using solder balls. The semiconductor element 21 is then reversed so that the Cu pillars 22 face downwards. The plating layers 23 are then aligned with the Cu pillars 22, and the semiconductor element 21 is connected to the lead 102 by allowing the solder 30 having molten during the reflow process to solidify. This process is referred to as a flip-chip bonding.

At this time, in the lead frame 100 according to the embodiment, the plating layer 23 is formed in the area surrounded by the inner circumference of the recessed portion 24, where the plating layer 23 is less likely to be misaligned with respect to the lead 102. Therefore, when the plating layer 23 is coupled to the Cu pillar 22, both can be ensured to have a sufficient coupling surface, so that the semiconductor element 21 and the lead 102 can be bonded reliably.

At the step illustrated in FIG. 12B, the mold resin 27 is formed in a manner covering a part of the lead 102, and the semiconductor element 21. The mold resin 27 is formed using a method such as transfer molding, compression molding, or injection molding. In this condition, the outer terminals 28 of the leads 102 are exposed from the mold resin 27.

At the step illustrated in FIG. 12C, the plating layer 29 is formed on the outer terminal 28 of the lead 102, where the outer terminal 28 is exposed from the mold resin 27. This plating layer 29 is tin plating or solder plating, for example. The plating layer 29 is made via electroplating or electrodeless plating, for example. The semiconductor device 200 illustrated in FIG. 6 is then acquired by dicing the lead frame 100 along the cutting line L1 in a dicing process.

As explained above, in the lead frame according to the embodiment, a plating resist is applied to a substrate having a recessed portion in a manner surrounding a desired area on which the plating layer is intended to be formed, and the substrate is exposed, with desired area covered by a mask having a size larger than the desired area, so that the plating resist is removed from the desired area and the plating layer is formed in the desired area. In this manner, the plating layer can be formed at a desired position. In particular, by providing the recessed portion in a manner surrounding the desired area to be plated, plating can be applied reliably to the desired area.

Furthermore, by disposing the oxidized layer in a manner surrounding the plating layer, the wet solder for coupling the plating layer and the electrodes can be suppressed from spreading any further. In this manner, it is possible to suppress misalignment, in coupling the electrodes of the semiconductor element to the leads, so that the semiconductor element can be bonded reliably to the leads.

Furthermore, by making the bottom surface of the recessed portion a curved surface, even if a mask having a size larger than the desired area is placed, considering the misalignment precision of the machine, even the part behind the mask can be exposed by reflection, so that the oxidized layer can be formed reliably to the part other than the desired area.

Furthermore, in this embodiment, silver plating is applied, for example, to the desired area of the lead made of copper. In this manner, wet solder is allowed to spread across the desired area, so that electronic components such as an IC chip can be bonded reliably to the lead.

Modifications

The embodiment described above may also be implemented in the configurations described below. In the explanation hereunder, the members that are the same as those in the embodiment are assigned with the same reference numerals, and explanations thereof will be sometimes partly or entirely omitted.

In the example explained in the embodiment described above, it is assumed that the shape of the surface to which the Cu pillar 22 is soldered is circular, but the Cu pillar 22 may have another shape. For example, the Cu pillar 22 may have an elliptic or rectangular shape. In such a case, it is preferable for the plating layer 23 to have the same shape as the Cu pillar 22.

Furthermore, when it is acceptable for the solder 30 to flow by some extent, the plating layer 23 may be larger than the Cu pillar 22 to the extent to which the flowing of the solder 30 is acceptable.

Figure 13:
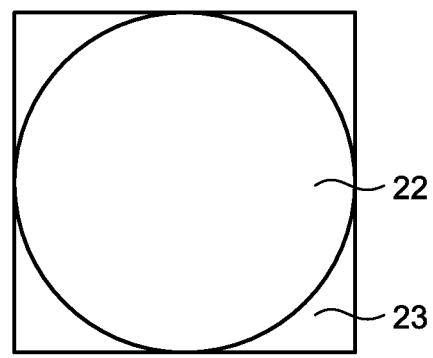
FIG. 13 is a schematic illustrating the bonding between a Cu pillar having a circular bonding surface and a rectangular plating layer.

Furthermore, the Cu pillar 22 and the plating layer 23 may have different shapes, as long as the Cu pillar 22 has a size included in the plating layer 23, and the size difference is within the range in which flowing of the solder 30 is acceptable. For example, as illustrated in FIG. 13, when the Cu pillar 22 has a circular bonding surface, the plating layer 23 may have a rectangular shape in a size including the circular shape. FIG. 13 is a schematic illustrating a relation between a Cu pillar having a circular bonding surface, and a rectangular plating layer.

Figure 14A:
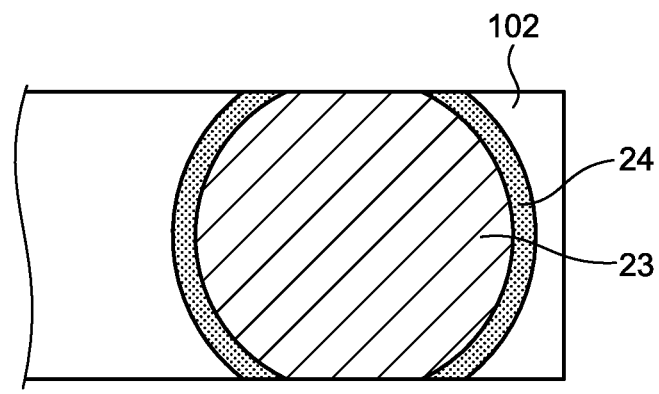
FIG. 14A is a schematic illustrating one example of the plating layer reaching the outer edges of the lead in the width direction.
Figure 14B:
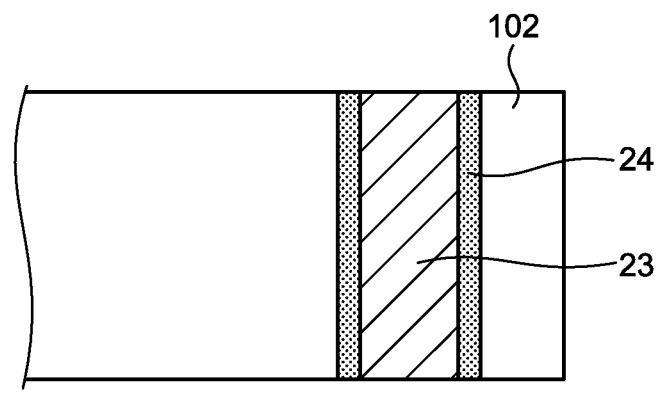
FIG. 14B is a schematic illustrating one example of the plating layer reaching the outer edges of the lead in the width direction.

Furthermore, in the example explained in the embodiment described above, it is assumed that the plating layer 23 has a size included in the front surface of the lead 102, but the plating layer 23 may reach the outer edges of the lead 102, in a width direction of the lead 102 in FIG. 2, that is, in a direction perpendicularly intersecting with the direction travelling from the frame portion 101 to the center. For example, as illustrated in FIG. 14A, the plating layer 23 extends to both sides of the lead 102 in the width direction. In such a configuration, the recessed portion 24 is laid in a manner penetrating the lead 102 in the width direction. Furthermore, as illustrated in FIG. 14B, the recessed portion 24 may be linear, and the plating layer 23 may have a rectangular shape reaching both sides of the lead 102 in the width direction. FIGS. 14A and 14B are schematic illustrating some examples of the plating layer reaching the outer edges of the lead in the width direction.

As explained above, even when the shape of the bonding surface between the plating layer and the electrode of the semiconductor element is not circular, or when the plating layer reaches the outer edges of the lead, it is possible to form the plating layer at a desired position by providing a recessed portion. Furthermore, by disposing the oxidized layer in a manner surrounding the plating layer, the wet solder for coupling the plating layer and the electrode of the semiconductor element can be suppressed from spreading any further. In this manner, it is possible to suppress misalignment, in coupling the electrodes of the semiconductor element to the leads, so that the semiconductor element can be bonded reliably to the leads.

Furthermore, even when the plating layer has a shape different from that of the bonding surface of the electrode of the semiconductor element, the electrode can be bonded reliably to the lead, as long as the amount of flow of the solder is within an acceptable range.

According to one aspect of the present invention, it is possible to suppress chipping of the plating layer.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A lead frame comprising:
   a lead portion having a first portion and a second portion thinner than the first portion;
   a plating layer that is provided on a connected area located on the second portion of the lead portion and extends to both edges of the lead portion in a width direction of the lead portion, the connected area being an area connected with a semiconductor element;
   a pair of recessed portions that face each other across the plating layer on the second portion of the lead portion and penetrate the lead portion in the width direction; and
   an oxidized layer that is provided on a surface including the pair of recessed portions of the lead portion, wherein a bottom surface of each of the pair of recessed portions is, at a cross-section perpendicular to the width direction, a curved surface, and an inner edge of each of the pair of recessed portions is coplanar with an outer edge of the plating layer in plan view.

2. The lead frame according to claim 1, wherein the pair of recessed portions surround a perimeter of the plating layer.

3. The lead frame according to claim 1, wherein
the lead portion is made of copper, and
the plating layer is made of silver.

4. The lead frame according to claim 1, wherein the oxidized layer is made of oxide of a metal of which the lead portion is made.

5. The lead frame according to claim 1, wherein the oxidized layer covers an upper surface and a side surface of the lead portion, and exposes a lower surface of the lead portion.

6. The lead frame according to claim 1, wherein the oxidized layer contains hydroxide.

7. The lead frame according to claim 1, wherein, in plan view, the outer edge of the plating layer has a circular arc shape and the inner edge of each of the pair of recessed portion has a circular arc shape.

8. A semiconductor device comprising:
a semiconductor element that has a terminal;
a lead portion;
a plating layer that is provided on a connected area of the lead portion and extends to both edges of the lead portion in a width direction of the lead portion, the connected area being an area connected with the semiconductor element;
a pair of recessed portions that face each other across the plating layer on the lead portion and penetrate the lead portion in the width direction;
an oxidized layer that is provided on a surface including the pair of recessed portions of the lead portion;
a solder portion that connects the plating layer and the terminal of the semiconductor element; and
an encapsulation resin that covers the lead portion and the semiconductor element,
wherein a bottom surface of each of the pair of recessed portions is, at a cross-section perpendicular to the width direction, a curved surface, and
an inner edge of each of the pair of recessed portions is coplanar with an outer edge of the plating layer in plan view.

9. The semiconductor device according to claim 8, wherein the pair of recessed portions surround a perimeter of the plating layer.

10. The semiconductor device according to claim 8, wherein
the lead portion is made of copper, and
the plating layer is made of silver.

11. The semiconductor device according to claim 8, wherein the oxidized layer is made of oxide of a metal of which the lead portion is made.

12. The semiconductor device according to claim 8, wherein the oxidized layer covers an upper surface and a side surface of the lead portion, and exposes a lower surface of the lead portion.

13. The semiconductor device according to claim 8, wherein the oxidized layer contains hydroxide.

14. The semiconductor device according to claim 8, wherein
the lead portion has a first portion and a second portion thinner than the first portion, and
the plating layer and the pair of recessed portions are provided on the second portion.

15. The semiconductor device according to claim 8, wherein, in plan view, the outer edge of the plating layer has a circular arc shape and the inner edge of each of the pair of recessed portion has a circular arc shape.

* * * * *